United States Patent [19]
Matsui et al.

[11] Patent Number: 5,982,245
[45] Date of Patent: Nov. 9, 1999

[54] RADIATING OSCILLATOR APPARATUS FOR MICRO-AND MILLIMETER WAVES

[75] Inventors: Toshiaki Matsui; Masami Murata, both of Tokyo, Japan

[73] Assignee: Communications Research Laboratory, Ministry of Posts and Telecommunications, Tokyo, Japan

[21] Appl. No.: 09/034,322

[22] Filed: Mar. 4, 1998

[30] Foreign Application Priority Data

Jul. 11, 1997 [JP] Japan .................................. 9-220579

[51] Int. Cl.$^6$ ...................................................... H03B 5/18
[52] U.S. Cl. ................................ 331/99; 331/55; 331/56; 331/117 D; 455/129
[58] Field of Search ........................... 331/96, 99, 117 D, 331/55, 56; 455/129

[56] References Cited

U.S. PATENT DOCUMENTS

| | | | |
|---|---|---|---|
| 4,736,454 | 4/1988 | Hirsch | 331/117 D |
| 5,115,210 | 5/1992 | Cummings et al. | 331/117 D |
| 5,450,040 | 9/1995 | Matsui et al. | 331/96 |

OTHER PUBLICATIONS

Robert A. Flynt, et al., IEEE Transactions on Microwave Theory and Techniques, vol. 44, No. 10, pp. 1642–1649, Oct. 1996, "Low Cost And Compact Active Integrated Antenna Transceiver for System Applications".

Robert A. York, et al., IEEE Transactions on Microwave Theory and Techniques, vol. 39, No. 6, pp. 1000–1009, Jun. 1991, "Quasi–Optical Power Combining Using Mutually Synchronized Oscillator Arrays".

*Primary Examiner*—Siegfried H. Grimm
*Attorney, Agent, or Firm*—Oblon, Spivak, McClelland, Maier & Neustadt, P.C.

[57] ABSTRACT

A radiating oscillator apparatus for micro- and millimeter waves includes paired fan-shaped conductor patches disposed with their pointed portions in proximity and their arcuate portions on opposite sides, at least one high-frequency transistor disposed between and connected to the fan-shaped conductor patches, a conductor planar surface disposed under and parallel to the fan-shaped conductor patches at an interval of between one-fifteenth and one-fifth the generated wavelength therefrom, and a pair of direct current power supplies connected to the fan-shaped conductor patches separately with a common ground potential.

7 Claims, 6 Drawing Sheets

RADIATING OSCILLATOR APPARATUS FOR MICRO-AND MILLIMETER WAVES

BACKGROUND OF THE INVENTION

1. Field of the Invention

This invention relates to a radiating oscillator apparatus for micro- and millimeter waves that integrates electromagnetic wave radiation antenna and high-frequency wave oscillation capabilities, is usable in high-efficiency microwave submillimeter-region telecommunication apparatus and radiometry technologies, and incorporates spatial power combining for high-power output.

2. Description of the Prior Art

Conventional radio equipment, including widely-used radio communication apparatuses and different types of radiometry equipment such as radar systems and radiometers, is configured by combining antenna apparatus technologies and transmitter/receiver technologies related mainly to high-frequency circuitry. Antenna apparatus technologies for efficiently radiating electromagnetic waves and receiving electromagnetic wave signals according the intended purpose and high-frequency circuit technologies for the transmitters and receivers that handle signal processing and control have long constituted mutually independent fields of technology. They meet only in the need to match the antenna input and circuit output impedances.

The telecommunications equipment technology sector is seeing sweeping changes. Recent advances in semiconductor device technology have led to the development of technologies enabling amplifier, oscillator, multiplier, mixing and other high-frequency circuit element functions to be achieved by integrated planar circuits. These high-frequency integrated circuit technologies are widely looked to as providing next-generation radio communication apparatus technologies for achieving apparatuses whose integrated planar circuitry makes them simultaneously compact, light, highly performable, highly reliable and inexpensive. As such, they can be expected to obviate the conventional system of configuring apparatuses by interconnecting waveguide and coaxial circuit components. This evolving technology environment is creating a need for the development of new micro- and millimeter wave technologies that can integrate the antenna with the IC. The progress in high-frequency circuit semiconductor device technology has generated demand for a broad range of technologies. Among these are technologies that can provide the new device functions needed to configure micro- and millimeter wave mobile communications systems. Also needed are technologies for providing radiometry control systems with new capabilities, such as high-performance antenna beam shaping techniques and micro- and millimeter wave imaging techniques.

As frequency rises in the micro- to millimeter wave region, dielectric loss and conductor loss at the conductor surface increase to pose a major problem in terms of transmission line loss. Regarding antenna gain enhancement by arraying a planar antenna, this means both heavy feeder loss and a large drop in system total performance and efficiency owing to the connection through the long transmission line in the micro- and millimeter wave radio apparatus. Development of a new technology for integrating the antenna and the high-frequency planar circuit is therefore much needed. For this, however, numerous difficult technical problems will have to be solved.

In the simplest configuration, with the active circuit and the antenna circuit disposed adjacently on the same plane, it is difficult with high-frequency coupling to realize the desired apparatus performance by the antenna pattern, oscillator frequency, discrepancy of noise characteristics and the like. While rigorous consideration of spatial intercoupling methods is required in such cases, these are generally complex and, except in special cases, usually difficult to solve by electromagnetic field analysis.

As is clear from the foregoing, realization of transmitter technologies enabling efficient high-frequency generation and output as well as impartation of objective-matched directionality for radiation in the required direction requires development of a new method for functionally integrating the oscillator circuit and the antenna with high efficiency. Insufficient level of the high-frequency signal intended for transmission to a desired location has conventionally been coped with by either increasing the output of the signal source or increasing the antenna gain.

Provided that a signal source can be easily obtained that has sufficiently high output to compensate for the drop in radiation efficiency caused by the feeder loss, a multi-element antenna array with a sharp antenna characteristic can be assembled. In fact, however, millimeter wave semiconductor devices are fabricated using ultrafine processing technologies to provide the fine geometry needed to secure high-frequency characteristics. Since the power that individual devices can handle therefore falls sharply with increasing frequency, the finding of ways to achieve adequate output in the millimeter wave region is an important topic of technical research.

Securing sufficiently large high-frequency output in the micro- and millimeter wave regions requires the establishment of a technology for efficiently generating high-frequency output from individual devices. It also requires development of a new power combining technology for efficiently synthesizing the high-frequency outputs obtained from individual devices. One promising technology for power combining in the millimeter wave region, where transmission line loss is a particular problem, is the quasi-optical spatial phase synthesis method.

York et al. have reported a technique for spatial power combining by integrating planar patches serving as both a resonator and an antenna with an amplifier device and extracting high-frequency power as spatial output (R. A. York and R. C. Compton, "Quasi-Optical Power Combining Using Mutually Synchronized Oscillator Arrays", IEEE Trans. on Microwave Theory and Tech., Vol. MTT-39, pp. 1000–1009, 1991). They report on use of a two-terminal device (a Gunn diode) and a three-terminal device.

Matsui, one of the inventors of this invention, and coworkers have reported an effective method that combines antenna capability enabling efficient radiation of electromagnetic waves into space and resonator capability for configuring an oscillator integrated with a negative resistance amplifier circuit (U.S. Pat. No. 5,450,040). This method uses a Fabry-Perot resonator composed of spherical mirrors. The portion that couples with space forms a partially transparent, high-reflectance mirror surface and the other reflecting mirror surface is provided with a portion that couples with a negative resistance amplifier circuit and constitutes part of the conductor reflecting mirror surface thereof. By making this coupling relatively strong compared with that on the side coupled with space, high-frequency energy is accumulated inside the quasi-optical resonator to obtain a function as an antenna that leaks out the interior electromagnetic field of Gaussian distribution formed about the optical axis during steady state. As a result, use as a low sidelobe beam output oscillator apparatus is possible.

This beam output oscillator apparatus using a Gaussian beam resonator provides a number of outstanding features. One of these is a degree of freedom in determining the balance between high-frequency spectral purity and high-frequency output efficiency, which can be adjusted by selecting the combination between the coupling state of the resonator/antenna with space and the strength of the coupling between the resonator and the amplifier device. Another is the possibility of constituting the resonator portion of quartz, which has a low temperature coefficient and small loss, to obtain a high Q value that ensures simultaneous realization of high spectral purity and frequency stability and thus enables extraction of a good quality beam.

On the other hand, the Gaussian beam resonator is limited in application owing to its aperture of several wavelengths. Moreover, it is by nature a high-Q resonator and, as such, is not appropriate for use in wideband frequency modulation, multifrequency sharing and other such applications. Further, although suitable for overlaying with a planar circuit, a resonator shaped like a plano-convex lens with a spherical mirror on one side is relatively high in cost and a new solution is required from the aspect of cost reduction.

The technologies described in the foregoing have been unable to provide an oscillator apparatus capable of simultaneously achieving high frequency output with high efficiency and wideband characteristics from microwave to the still higher frequency millimeter wave region, high gain through array layout, and enhanced freedom of response to the need for higher output.

The present invention was accomplished in the light of the foregoing circumstances and has as an object to provide an oscillator apparatus for micro- and millimeter waves that constitutes an oscillator by integrating a resonator of planar structure and an amplifier device, simultaneously provides the resonator with the additional capability of a radiator for radiating electromagnetic waves into space, and enables high-frequency output to be extracted into space at high efficiency.

Another object of the invention is to provide an oscillator apparatus for micro- and millimeter waves suitable for implementing high-efficiency power combining.

SUMMARY OF THE INVENTION

To achieve these objects, the invention provides a radiating oscillator apparatus for micro- and millimeter waves comprising:

paired fan-shaped conductor patches disposed with their pointed portions in proximity and their arcuate portions on opposite sides, a distance from the pointed portion to the arcuate portion of each fan-shaped conductor patch being equal to about one-fourth of a wavelength of oscillating electromagnetic-wave, at least one high-frequency transistor disposed between and connected to the fan-shaped conductor patches, a conductor planar surface disposed under and parallel to the fan-shaped conductor patches at an interval of between one-fifteenth and one-fifth the wavelength of oscillating electromagnetic-wave therefrom, and a direct current power supply connected to each fan-shaped conductor patch, a source potential of the direct current power supply being defined as ground potential.

This invention encompasses an oscillator apparatus constituted by arraying a plurality of radiating oscillator apparatuses for micro- and millimeter-waves of the foregoing structure in a single plane to have the same polarity orientation.

The high-frequency transistor can be a field effect high-frequency transistor having a gate connected to one of the fan-shaped conductor patches, a drain connected to the other thereof and a source connected to ground. The invention further encompasses a radiating oscillator apparatus for micro- and millimeter waves wherein the high-frequency transistor is a junction high-frequency transistor having a base connected to one of the fan-shaped conductor patches, a collector connected to the other thereof and an emitter connected to ground.

The at least one high-frequency transistor disposed midway between the fan-shaped conductor patches can be a single transistor or multiple transistors connected in parallel.

The radiating oscillator apparatus for micro- and millimeter waves of the foregoing configuration exhibits resonance with respect to an electromagnetic wave whose half wavelength is substantially equal to the distance between the opposite extremities of the fan-shaped conductors. Moreover, the distance between the fan-shaped conductor patch surfaces and the conductor planar surface extending parallel thereto is about 3 to 10 times the thickness of an ordinary strip line or of the circuit board used in a planar antenna substrate. Therefore, the paired fan-shaped conductor patches do not constitute a planar antenna matched to space at the resonant frequency and the result is a planar resonator whose coupling with space is weak. The gate and drain of the high-frequency transistor disposed midway between the fan-shaped conductor patches are connected to different ones of the fan-shaped conductor patches and are both biased by the direct current power supplies, while the source is connected to ground, thereby constituting a high-frequency amplifier with grounded source. A noise signal occurring on the gate side is amplified and induces a high-frequency current in the fan-shaped conductor patch connected to the drain. The resulting high-frequency electromagnetic field is guided radially between the undersurface of the fan-shaped conductor patch and the parallel conductor surface. Upon reaching the extremity of the fan-shaped conductor patch, most of it is reflected and returns in the opposite direction. It then propagates back and forth through the fan-shaped conductor patch on the other side and is again amplified upon entering the gate of the field effect high-frequency transistor in the middle. The waveguides formed by the paired fan-shaped conductor patches and the parallel conductive surface opposed to their undersurfaces form a feedback circuit of the amplifier constituted by the high-frequency transistor. At this time, oscillation power builds up with respect to the frequency component that matches the resonant frequency determined by the distance between the opposite extremities of the paired fan-shaped conductor patches and satisfies the relationship of the feedback from the output to the input of the amplifier being in positive feedback phase, thereby storing energy in the planar resonator formed by the paired fan-shaped conductor patches. In the steady state, part of the high-frequency energy stored in the planar resonator composed of the weakly space-coupled fan-shaped conductor patches and the high-frequency transistor is radiated into space at a constant rate. Since the interval between the surfaces of the fan-shaped conductor patches and the conductor planar surface lying parallel thereto is selected to be between one-fifteenth and one-fifth the wavelength, a radiating oscillator apparatus for micro- and millimeter waves can be realized wherein matching with space at the resonant frequency of the fan-shaped conductor patches can be selected, the coupling strength of the planar resonator and the high-frequency amplifier can be adjusted by selecting the spread angle of the fan-shaped conductor patches, and the power from the externally connected direct current power supplies can be extracted into space as high-frequency oscillation power with high efficiency.

Moreover, in accordance with the radiating oscillator apparatus for micro- and millimeter waves configured in the foregoing manner, individual radiating oscillator apparatuses each constituted by integrating paired fan-shaped conductor patches and a high-frequency transistor operate as radiating oscillator apparatuses for micro- and millimeter waves that enable power from externally connected direct current power supplies to be extracted into space as high-frequency oscillation power with high efficiency. Since the multiple pairs of fan-shaped conductor patches are made of the same material to have the same shape and dimensions and the high-frequency transistors midway between the respective pairs are of identical type and characteristics, there are obtained radiating oscillator apparatuses for micro- and millimeter waves of substantially the same frequency that operate as high-efficiency high-frequency oscillator apparatuses. These radiating oscillator apparatuses for micro- and milli-waves are arrayed in the same plane so that the high-frequency transistors have the same polarity orientation. As a result, the output of each radiation oscillator apparatus synchronizes with the outputs of the adjacent radiating oscillator apparatuses of the same type so that the overall radiating oscillator apparatus for micro- and millimeter waves obtained is capable of very high-efficiency spatial power synthesis.

Although a field effect high-frequency transistor can be used as the high-frequency transistor, it is also possible to use a junction high-frequency transistor and therefore possible to take advantage of the characteristics of the junction high-frequency transistor to fabricate a low-noise radiating oscillator apparatus for micro- and millimeter waves or a radiating oscillator apparatus for micro- and millimeter waves capable of high-efficiency spatial power combining.

When two or more high-frequency transistors are disposed midway between the paired fan-shaped conductor patches in parallel connection, moreover, the saturation power becomes greater than in the case of a single high-frequency transistor by a factor equal to the number of parallel-connected transistors or at maximum by a factor equal to the square of the number of parallel-connected transistors. This greatly increases the saturation power of the resonator and, as such, enables high-frequency generation to build up to the state of enabling accumulation of a large amount of energy in the resonator, whereby there can be realized a radiating oscillator apparatus for micro- and millimeter waves exhibiting high spectral purity and large high-frequency output.

The above and other features of the present invention will become apparent from the following description made with reference to the drawings.

DESCRIPTION OF THE PREFERRED EMBODIMENTS

The prior art oscillator apparatus will first be briefly explained with reference to the drawings.

Figure 1:
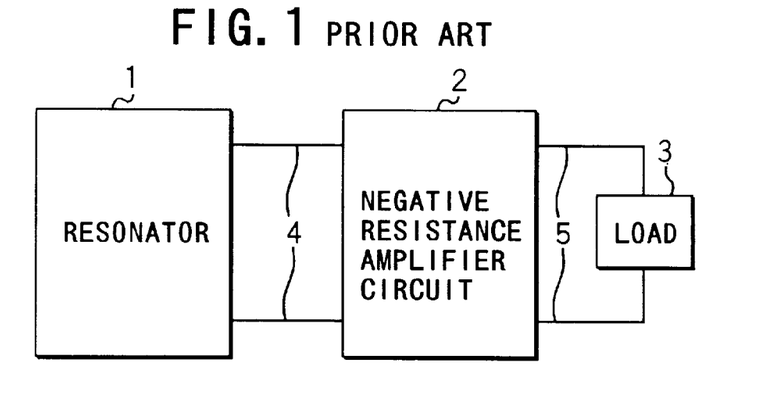
FIG. 1 is a diagram for explaining the concept of a prior art oscillator apparatus for the high-frequency region.

FIG. 1 is a diagram for explaining the concept of a prior art oscillator apparatus for the high-frequency region, showing the case where a resonator 1 and a negative resistance amplifier circuit 2 are connected by a waveguide 4, a load 3 is connected to other terminals of the negative resistance amplifier circuit 2 by a waveguide 5, and oscillation power is extracted from a port separate from the resonator 1. This is an oscillator apparatus configuration widely used in portable telecommunication devices and the like in the microwave and lower frequency regions. A miniaturized, high-permittivity dielectric resonator or the like is incorporated in the resonator 1.

Figure 2:
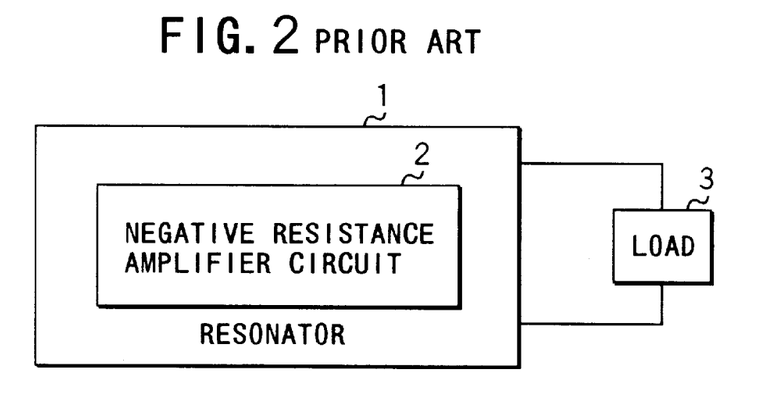
FIG. 2 is a diagram for explaining the concept of a prior art oscillator apparatus whose resonator for high-frequency generation also functions as an electromagnetic wave output element.

FIG. 2 is a diagram for explaining the concept of a prior art oscillator apparatus differing from that in FIG. 1 in that its resonator for high-frequency generation also functions as an electromagnetic wave output section. In this case, a negative resistance amplifier circuit 2 is incorporated into a resonator 1 and the load 3 represents the amount of additional loss caused by extraction of the oscillation power to the resonator exterior. Typical of this configuration is the laser oscillator apparatus having an amplification medium inside the resonator. In this case, the extraction of oscillation power into space as a beam from a partially transparent reflecting mirror surface of the laser resonator corresponds to the load 3.

Figure 3:
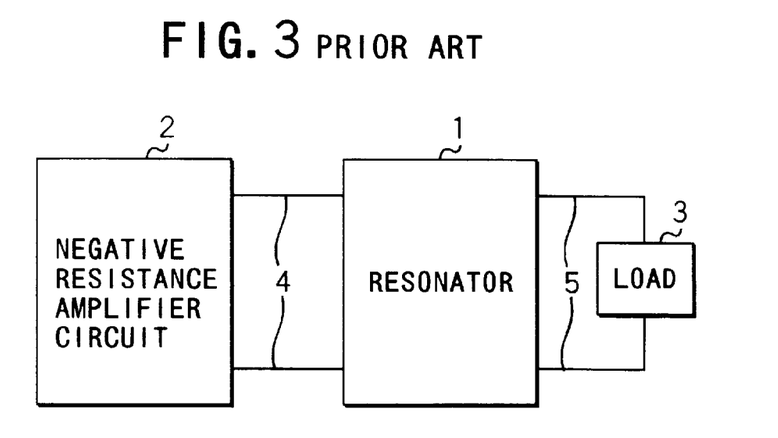
FIG. 3 is a diagram for explaining the concept of another prior art oscillator apparatus whose resonator for high-frequency generation also functions as an electromagnetic wave output element.

FIG. 3 is a diagram for explaining the concept of another prior art oscillator apparatus whose resonator for high-frequency generation also functions as an electromagnetic wave output element. Here, a resonator 1 and a negative resistance amplifier circuit 2 are connected by a transmission line 4 and the load 3 represented as an impedance $Z_L$ represents the amount of additional loss caused by extraction of the high-frequency oscillation power to the resonator exterior as a beam 5. This configuration has been described by one of the inventors of this invention and coworkers as an oscillator apparatus for micro- and millimeter waves integrating a Gaussian-beam resonator and a negative resistance amplifier circuit (Gaussian-Beam Oscillator For Microwave And Millimeter Wave, U.S. Pat. No. 5,450,040). The principle of the prior art oscillator apparatus of FIG. 3, which is a modification based on the configuration of FIG. 2, can, by removing the amplification medium from the interior of the resonator, provide two parameters capable of controlling the oscillation conditions, whereby it achieves advantageous conditions from the aspect of oscillator apparatus technology.

Figure 4:
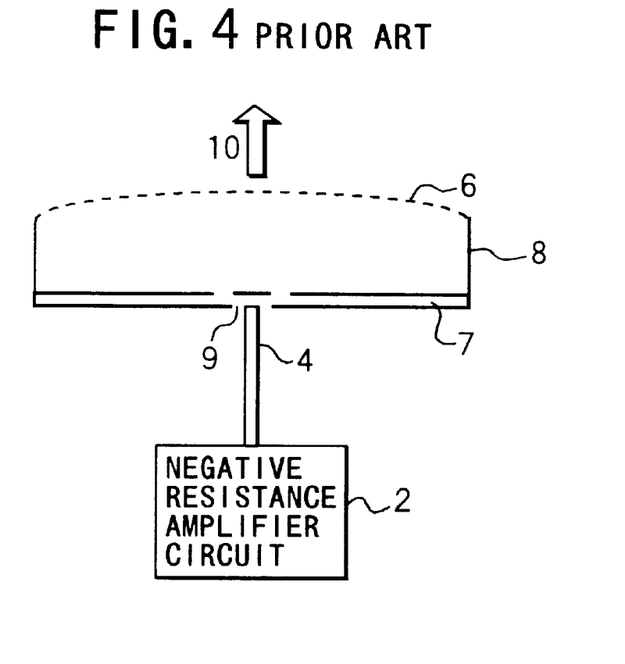
FIG. 4 is a diagram for explaining the concept of a prior art beam output oscillator apparatus for micro- and millimeter waves.

FIG. 4 is a diagram for explaining the concept of a prior art beam output oscillator apparatus for micro- and millimeter waves that is a concrete embodiment of the configuration of FIG. 3. Here, the resonator 1 of FIG. 3 is a Fabry-Perot resonator 8 composed of a partially transparent spherical reflecting mirror 6 and a conductor reflecting mirror 7, the negative resistance amplifier circuit 2 is connected through a transmission line 4 to a coupling region 9 constituting part of the conductor reflecting mirror 7 of the resonator 8, a two-dimensional conductor thin-film grid or the like is used as the spherical reflecting mirror 6, and the resonant mode exhibits Gaussian distribution about the optical axis because one or the other of the spherical reflecting mirror 6 and the conductor reflecting mirror 7 is a spherical mirror. Further, the reflectance of the spherical reflecting mirror 6 is set higher than the reflectance of the conductor reflecting mirror 7 so that, as seen from the side of the negative resistance amplifier circuit, the resonator 8 is configured to be weakly coupled with space to give the appearance of a single terminal resonator, the interaction between the resonator and the negative resistance amplifier circuit builds up the oscillation to increase the high-frequency energy accumulated in the resonator, the power of the beam output 10 leaking as a Gaussian beam from the partially transparent spherical reflecting mirror 6 rises accordingly, and a steady state is reached when the gain produced by the negative resistance amplifier circuit 2 and the total loss including the beam output come into balance.

In the apparatus of FIG. 4, since the reflectances of the partially transparent spherical reflecting mirror 6 and the conductor reflecting mirror 7, i.e., the coupling strength with space, and the coupling strength with the negative resistance amplifier circuit 2 can be independently set, two basic oscillator apparatus adjustment items, including phase adjustment through combination of the coupling region and the transmission line 4, can be substantially controlled. On the other hand, the Gaussian beam resonator is limited in application owing to its aperture of several wavelengths. Moreover, it is by nature a resonator with a relatively high Q value and, as such, is not appropriate for uses requiring wideband frequency characteristics.

Figure 5:
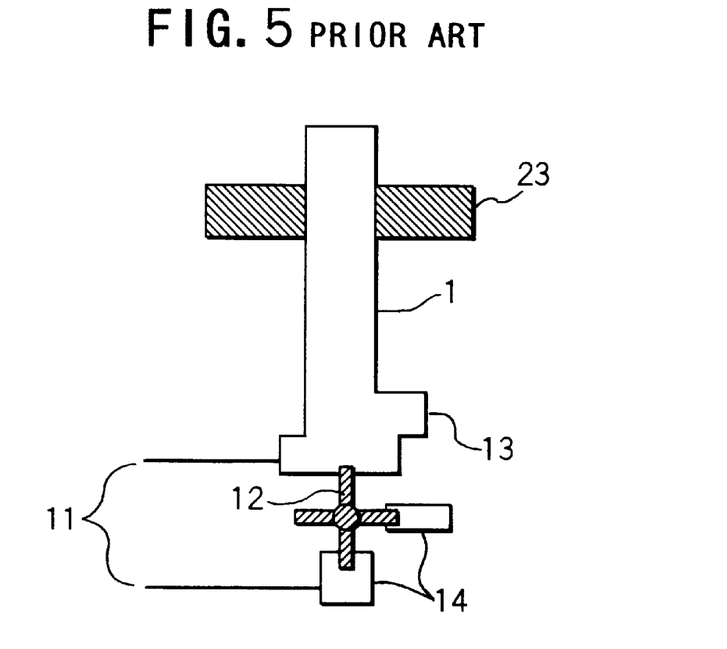
FIG. 5 is a diagram for explaining a prior art oscillator apparatus having a negative resistance amplifier circuit and an antenna element disposed adjacently in the same plane.

FIG. 5 is a diagram for explaining a prior art oscillator apparatus having a negative resistance amplifier circuit and an antenna element disposed adjacently in the same plane. A high-frequency transistor 12 is integrated with a resonator 1 composed of a strip line to constitute an oscillator as a negative resistance amplifier circuit, and direct current power supplied from a direct current bias line is converted to high-frequency power and radiated into space through an integrally connected slot antenna 23. In this case, since coupling of the oscillation between a stub 13 and/or the direct current bias line 11 of the strip line resonator 1 and the slot antenna 23 is hard to avoid, slight differences in impedance matching, resonant frequency, wire location and the like produce complex interactions that critically affect frequency spectrum, power output and radiation pattern, making the oscillator apparatus of FIG. 5 difficult to handle in practical applications.

Figure 6:
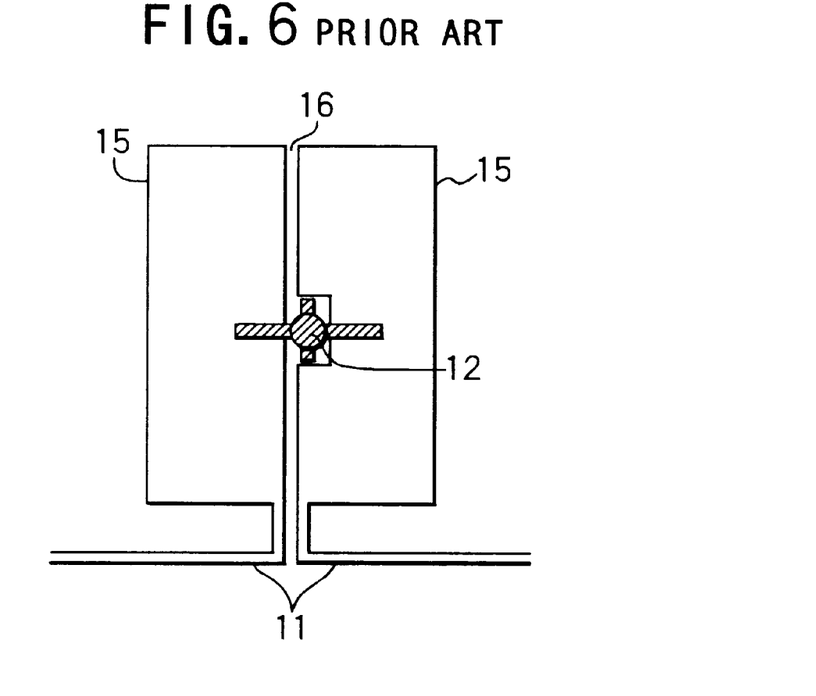
FIG. 6 is a diagram for explaining an example of a prior art radiating oscillator apparatus whose planar conductor patches serve both as a resonator for high-frequency generation and an electromagnetic wave output element.

FIG. 6 shows an example of a prior art radiation oscillator apparatus taught by R. A. York et al., whose planar conductor patches serve both as a resonator for high-frequency generation and an electromagnetic wave output section (R. A. York and R. C. Compton, "Quasi-Optical Power Combining Using Mutually Synchronized Oscillator Arrays", IEEE Trans. Microwave Theory Tech., Vol. MTT-39, pp. 1000–1009, 1991). Specifically, York et al. report a method of configuring a simple oscillator apparatus for micro- and millimeter waves by disposing two rectangular conductor patches 15 each formed as a broad low-impedance microstrip line across a narrow gap 16, connecting the drain and gate of a field effect high-frequency transistor (FET) 12 whose source is grounded one to each of the low-impedance microstrip lines, directly biasing the two low-impedance microstrip lines by direct current bias lines 11, and using the capacitive coupling by the narrow gap 16 as an amplifier positive feedback circuit to constitute a negative resistance amplifier circuit as seen from the side of the resonator in terms of high frequency.

Figure 7:
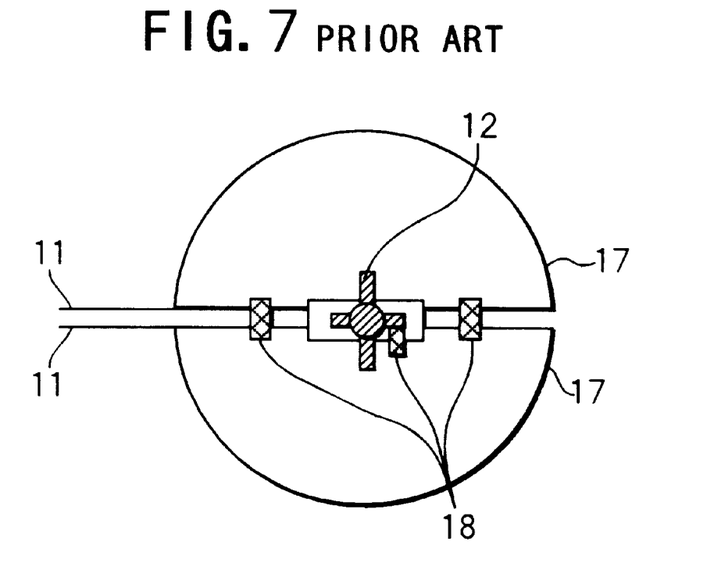
FIG. 7 is a diagram for explaining another example of a prior art radiating oscillator apparatus whose planar conductor patches serve both as a resonator for high-frequency generation and an electromagnetic wave output element.

FIG. 7 shows another example of a prior art radiation oscillator apparatus whose planar conductor patches serve both as a resonator for high-frequency generation and an electromagnetic wave output section (R. A Flynt, J. A. Navarrow and K. Chang, "Low Cost and Compact Active Integrated Antenna Transceiver for System Applications", IEEE Trans. Microwave Theory Tech., Vol. 44, pp. 1642–1649, 1996). Here, semicircular conductor patches 17 are opposed to each other and a field effect high-frequency transistor (FET) 12 is disposed at the center to configure a radiation oscillator apparatus whose principle is the same as the example shown in FIG. 6. The two semicircular conductor patches 17 are capacitively coupled by chip capacitors 18 across the gap 16, thereby establishing a phase condition for satisfying a negative resistance condition by positive feedback.

In order to build up oscillation and accumulate electromagnetic wave energy in the resonator, the feedback to the FET (transistor) gate side has to be conducted at an appropriate phase and ratio. When the combination of feedback phase and amplitude meets the condition required of a negative resistance amplifier circuit as seen from the resonator, oscillation becomes possible and a high-frequency electromagnetic field is accumulated in the resonator. At this time, for a negative resistance circuit to be seen from the resonator, the condition of positive feedback condition to the transistor amplifier must be satisfied and, further, the securement of weak coupling between the resonator and space is required as a basic condition.

In the case of the radiating oscillator apparatus using a resonator that also functions as an antenna shown in FIG. 6 or 7, a measure is provided to enable adjustment of the condition of positive feedback to the high-frequency transistor by adjusting the capacitance. However, the method shown in FIG. 6 of adjusting the capacitance by varying the width of the narrow gap between the two rectangular conductor patches does not allow the adjustment to be made with sufficient freedom. The method shown in FIG. 7 of coupling the circular conductor patches by the chip capacitors is not effective in the millimeter wave region without modification and is similarly deficient in freedom of adjustment. Moreover, as pointed out earlier, neither system takes into consideration the matter of securing a weakly coupled state between the conductor patches, i.e., the resonator and space, and neither makes any disclosure regarding a method of realizing a weakly coupled state between space and the resonator. The radiating oscillator apparatuses using resonators that also function as antennas shown in FIGS. 6 and 7 therefore do not disclose a method for realizing an optimum oscillation state.

In contrast, the present invention provides an oscillator apparatus for micro- and millimeter waves which secures two controllable parameters required for oscillation condition optimization and extracts high-frequency power into space with high efficiency—in the same way as realized by the prior art radiating oscillator apparatus whose resonator for high-frequency generation also functions as an electromagnetic wave output section that employs Fabry-Perot resonator technology and was explained with reference to FIG. 3—by a prior art radiating oscillator apparatus whose planar conductor patches serve both as a resonator for high-frequency generation and an electromagnetic wave output section. In addition, it provides a radiating oscillator apparatus for micro- and millimeter waves suitable for realizing high-efficiency power synthesis by spatial phase synchronization of multiple ones thereof in a planar array.

Figure 8A:
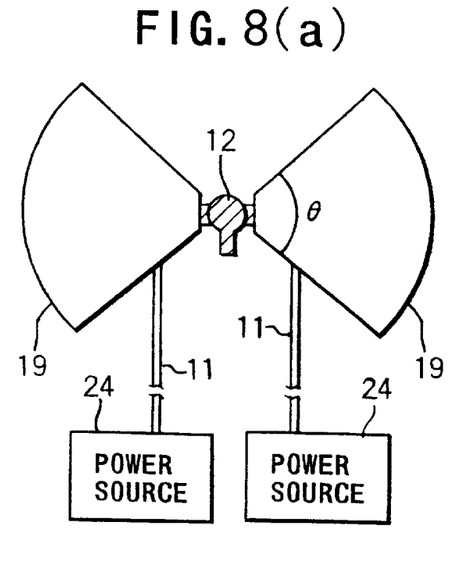
FIG. 8(a) is a diagram for explaining the planar configuration of a radiating oscillator apparatus for micro- and millimeter waves that is an embodiment of the invention.

FIG. 8(a) is a diagram for explaining the planar configuration of a radiating oscillator apparatus for micro- and millimeter waves that is an embodiment of the invention.

Figure 9:
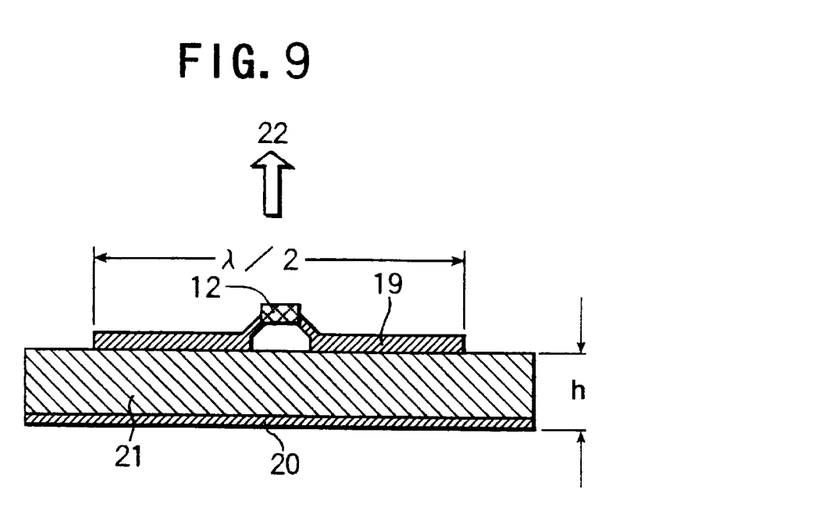
FIG. 9 is a diagram for explaining the cross-sectional configuration of the radiating oscillator apparatus for micro- and millimeter waves of FIG. 8(a).

FIG. 9 is a diagram for explaining the cross-sectional configuration of the radiating oscillator apparatus for micro- and millimeter waves of FIG. 8(a). Paired fan-shaped conductor patches 19 are disposed with their pointed portions in proximity and their arcuate portions on opposite sides. A field effect high-frequency transistor 12 is provided as a high-frequency transistor between the fan-shaped conductor patches 19 with its gate connected to one of the fan-shaped conductor patches 19 and its drain connected to the other. The source of the transistor 12 is connected to ground. A conductor planar surface 20 is provided to extend parallel to the undersurfaces of the fan-shaped conductor patches 19 at an interval of between about one-fifteenth and one-fifth the generated wavelength therefrom.

The radius of each fan-shaped conductor patch 19 (the distance from its pointed portion to its arcuate portion) is about one-fourth the wavelength of oscillating electromagnetic-wave. Each fan-shaped conductor patch 19 is connected through a direct current bias line 11 to a separate direct current power source 24 with ground potential connected to the source. FIG. 9 shows an embodiment having a low-loss dielectric substrate 21 sandwiched between the fan-shaped conductor patches 19 and the conductor planar surface 20.

The radiating oscillator apparatus for micro- and millimeter waves of the foregoing configuration exhibits resonance with respect to an electromagnetic wave whose half wavelength is substantially equal to the distance between the opposite extremities of the fan-shaped conductors 19. Moreover, the distance between the fan-shaped conductor patch surfaces and the conductor planar surface 20 extending parallel thereto is 3 to 10 times the thickness of an ordinary strip line or of the circuit board used in a planar antenna substrate. Therefore, the paired fan-shaped conductor patches 19 do not constitute a planar antenna matched to space at the resonant frequency and the result is a planar resonator whose coupling with space is weak. The gate and drain of the field effect high-frequency transistor 12 disposed midway between the fan-shaped conductor patches 19 are connected to different ones of the fan-shaped conductor patches 19 and are both biased by the direct current power supplies, and the source is connected to ground, thereby constituting a high-frequency amplifier with grounded source. A noise signal occurring on the gate side is amplified and induces a high-frequency current in the fan-shaped conductor patch 19 connected to the drain. The resulting high-frequency electromagnetic field is guided radially between the undersurface of the fan-shaped conductor patch 19 and the parallel conductor surface 21. Upon reaching the extremity of the fan-shaped conductor patch 19, most of it is reflected and returns in the opposite direction. It then propagates back and forth through the fan-shaped conductor patch 19 on the other side and is again amplified upon entering the gate of the field effect high-frequency transistor 12 in the middle. The transmission line formed by the paired fan-shaped conductor patches and the parallel conductive surface 20 opposed to their undersurfaces form a feedback circuit of the amplifier constituted by the high-frequency transistor 12. At this time, oscillation power builds up with respect to the frequency component that matches the resonant frequency determined by the distance between the opposite extremities of the paired fan-shaped conductor patches 19 and satisfies the relationship of the feedback from the output to the input of the amplifier being in positive feedback phase, thereby storing energy in the planar resonator formed by the paired fan-shaped conductor patches 19. In the steady state, part of the high-frequency energy stored in the planar resonator composed of the weakly space-coupled fan-shaped conductor patches 19 and the high-frequency transistor 12 is radiated into space as radiation output 22 at a constant rate. Tests showed that the selection of the interval between the surfaces of the fan-shaped conductor patches and the conductor planar surface 20 lying parallel thereto to be between one-fifteenth and one-fifth the wavelength made it possible to realize an oscillator apparatus for micro- and milli-waves wherein matching with space at the resonant frequency of the fan-shaped conductor patches can be selected and the reflective wave from the edge of the fan-shaped conductor patches and condition of the positive feedback to the high-frequency transistor disposed near the center can be effectively varied by selecting the spread angle θ of the fan-shaped conductor patches 19. By this there can be realized a radiating oscillator apparatus for micro- and millimeter waves that enables adjustment of the coupling strength of the planar resonator and the high-frequency amplifier constituted by the fan-shaped conductor patches 19 and the high-frequency transistor 12 and, further, permits fine adjustment of the positive feedback condition of the oscillator circuit to enable extraction of the power from the externally connected direct current power supplies into space as high-frequency oscillation power with high efficiency.

Figure 10:
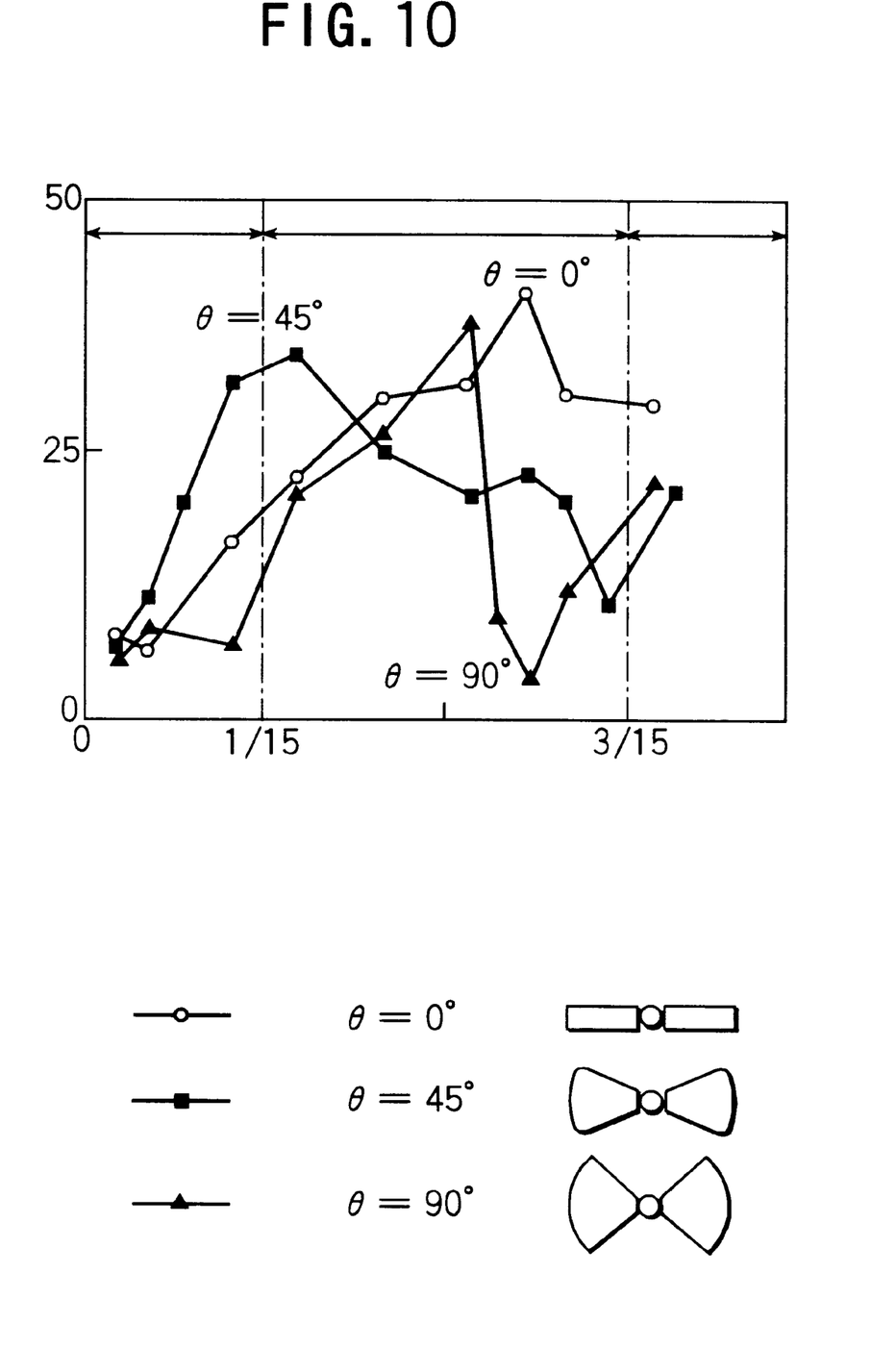
FIG. 10 is graph showing how the oscillating efficiency of the radiating oscillator apparatus for micro- and millimeter waves according to the invention varies as a function of substrate thickness h at different spread angles θ of paired fan-shaped conductor patches.

FIG. 10 is graph showing how the oscillating efficiency of the radiating oscillator apparatus for micro- and millimeter waves according to the invention varies as a function of substrate thickness h at different spread angles θ of paired fan-shaped conductor patches. The results were obtained by tests conducted at 10 GHz for three values of angle θ: 0, 45 and 90 degrees. The vertical axis represents conversion efficiency of direct current power consumed by the transistor to total radiation power expressed in percent. Total power radiation was calculated from received power based on estimated value for all solid angles taking antenna gain into consideration. The horizontal axis represents ratio of substrate thickness h to effective wavelength λ corrected for refractive index n and is scaled in λ. Stable oscillation was obtained in the region of substrate thickness between one-fifteenth and one-fifth wavelength. The point of maximum output shifted depending on the spread angle θ of the fan-shaped conductor patches but in all cases stable and efficient oscillation was obtained in this region of substrate thickness. Substrate thicknesses in this region are approximately 3 to 10 times greater than that of substrates ordinarily used to fabricate planar antennas or planar circuits for microwaves in the 10 GHz region. Use of the conductor patches on a substrate of this thickness enables configuration of a planar resonator coupled weakly with space. The maximum received power with a single element was 384 mW under conditions of a fan-shaped conductor patch spread angle θ of 0 degree and a substrate thickness h of 3.8 mm. The test results showed that high conversion efficiency of direct current power to high-frequency radiation power on the order of 35–40% can be achieved.

Figure 11:
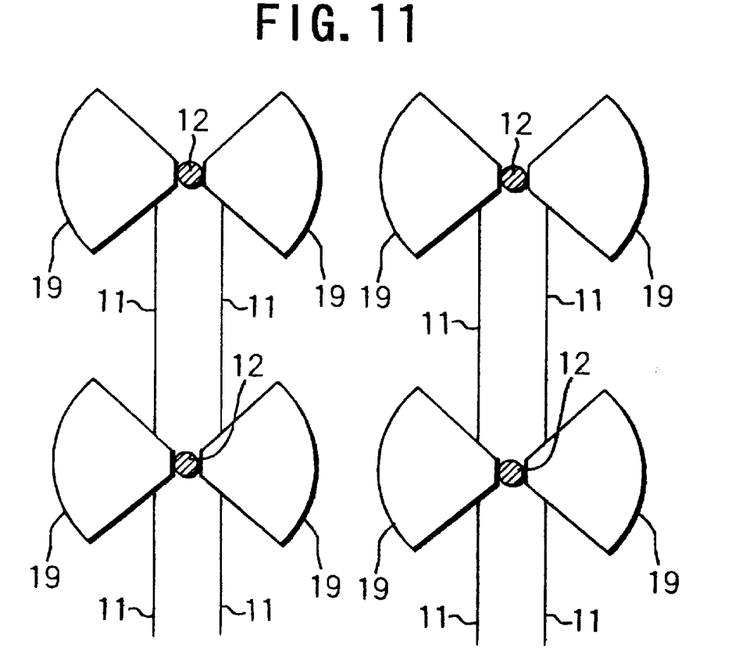
FIG. 11 is a diagram for explaining a radiating oscillator apparatus for micro- and millimeter waves according to the invention using an array configuration to achieve spatial power combining capability and radiation beam shaping capability.

FIG. 11 is a diagram for explaining a radiating oscillator apparatus for micro- and millimeter waves according to the invention using multiple FIG. 8(a) oscillator apparatuses disposed in an array to configure a radiating oscillator apparatus for micro- and millimeter waves having spatial power combining capability and radiation beaming capability. The array is configured by making multiple pairs of fan-shaped conductor patches 19 of the same material to have the same shape and dimensions, disposing the members of each pair with their pointed portions in proximity and their arcuate portions on opposite sides, disposing field effect high-frequency transistors 12 of identical type and characteristics one midway between each pair of fan-shaped conductor patches 19 with its gate and drain connected to different ones of the fan-shaped conductor patches 19 and its source connected to ground, and arraying multiple pairs of fan-shaped conductor patches 19 integrated with the high-frequency transistors 12 in the same plane to have the same polarity orientation.

In the radiating oscillator apparatus for micro- and millimeter waves structured in the foregoing manner, the individual radiation oscillator apparatuses each constituted by integrating paired fan-shaped conductor patches 19 and a field effect high-frequency transistor 12 operate as radiating oscillator apparatuses for micro- and millimeter waves that enable power from externally connected direct current power supplies to be extracted into space as high-frequency oscillation power with high efficiency. Since the multiple pairs of fan-shaped conductor patches 19 are made of the same material to have the same shape and dimensions and the field effect high-frequency transistors disposed midway between the respective pairs with their gates and drains connected to different ones of the fan-shaped conductor patches 19 are of identical type and characteristics, there are obtained radiating oscillator apparatuses for micro- and millimeter waves of substantially the same frequency that operate as high-efficiency high-frequency oscillator apparatuses. Moreover, since these oscillator apparatuses for micro- and millimeter waves are arrayed in the same plane so that the high-frequency transistors 12 have the same polarity orientation, the output of each radiating oscillator apparatus synchronizes with those of the adjacent radiating oscillator apparatuses of the same type so that the overall radiating oscillator apparatus for micro- and millimeter waves obtained is capable of very high-efficiency spatial power combining.

Figure 12:
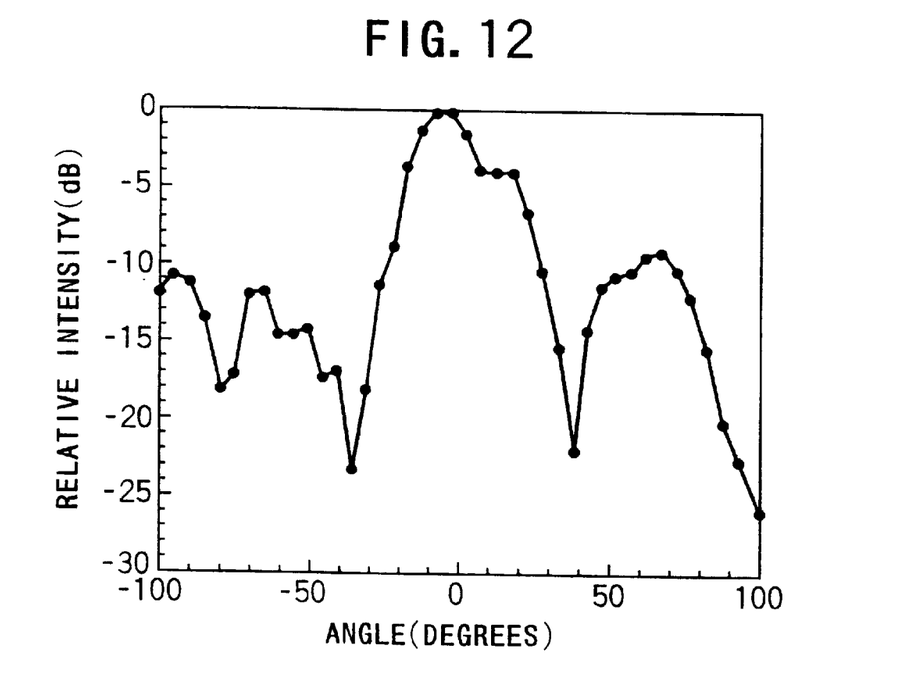
FIG. 12 is a graph showing the radiation pattern characteristic of a two-element array of the radiating oscillator apparatus for micro- and millimeter waves according to the invention.

FIG. 12 is a graph showing the radiation pattern characteristic of a two-element array of the radiating oscillator apparatus for micro- and millimeter waves according to the invention. The measurement of the radiation pattern of the radiating oscillator apparatus for micro- and millimeter waves constituted as a two-element array was conducted in an anechoic chamber. The beam output oscillator apparatus being tested was set as a transmitting antenna on a rotary stage and the angular dependence of the received power of a transmitted signal from a horn antenna was measured as the angle was changed. FIG. 12 shows an example of the measurement results of the beam output radiation pattern at 9.3 GHz, the vertical axis representing relative intensity and the horizontal axis rotational angle. The received power in the forward direction of the radiating oscillator apparatus for micro- and millimeter waves constituted as a two-element array exceeded four times the received power in the forward direction of a single-element radiating oscillator apparatus for micro- and millimeter waves. Even taking the improvement in directional gain produced by the two-element array into account, this amounts to at least a two-fold increase in spatial power synthesis and demonstrates that an oscillator apparatus for micro- and milli-waves constituted as a multi-element array has potential as a high-efficiency, high-power signal source.

When N number of radiating oscillator apparatuses are operated in mutual synchronization, the maximum output obtainable is theoretically $N^2$ times the output of a single radiating oscillator apparatus. Although in practice the output is usually smaller than this, the N-fold or greater output actually achieved is practically adequate. In a basic test, the arrayed oscillator apparatus for micro- and millimeter waves of the invention was confirmed to readily achieve an N-fold or greater output.

In the embodiments explained in the foregoing, the field effect high-frequency transistor 12 is disposed midway between the fan-shaped conductor patches 19 with its gate and drain connected to different ones of the fan-shaped conductor patches 19 and its source connected to ground. In accordance with the principle of the invention, however, the same amplification capability can basically be achieved instead by disposing a junction high-frequency transistor midway between the fan-shaped conductor patches 19 with its base and collector connected to different ones of the fan-shaped conductor patches 19 and its emitter connected to ground. Specifically, there can instead be similarly used as the high-frequency transistor a field effect transistor such as a high electron mobility transistor (HEMT), a MESFET transistor, a MOS transistor or a junction FET or a junction transistor such as a bipolar transistor or a heterobipolar transistor (HBT).

Substrate materials usable for forming the fan-shaped conductor patches of the radiating oscillator apparatus for micro- and millimeter waves according to the invention include such dielectric substrate materials exhibiting small high-frequency loss as high-purity silicon, quartz, sapphire, alumina, PTFE and polyethylene.

Figure 8B:
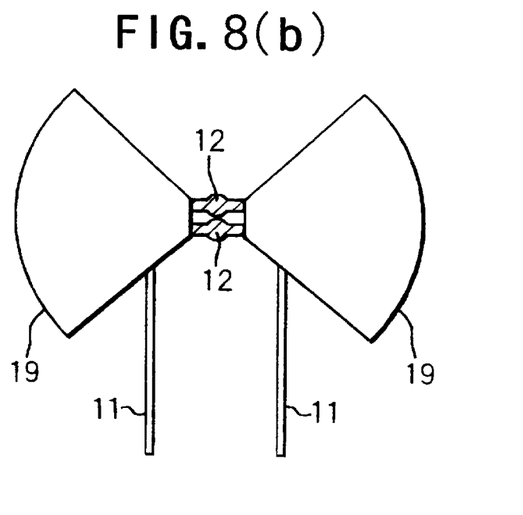
FIG. 8(b) is a diagram for explaining the planar configuration of a radiating oscillator apparatus for micro- and millimeter waves that is another embodiment of the invention.

Moreover, as shown in FIG. 8(b), multiple high-frequency transistors can be disposed in parallel connection midway between the fan-shaped conductor patches instead of the single high-frequency transistor in the foregoing embodiments. In this case, the saturation power becomes greater than in the case of a single high-frequency transistor by at least a factor equal to the number of parallel-connected transistors or at maximum by a factor equal to the square of the number of parallel-connected transistors. This greatly increases the saturation power of the resonator and, as such, enables high-frequency generation to build up to the state of enabling accumulation of a large amount of energy in the resonator. By this there can be realized a radiating oscillator apparatus for micro- and millimeter waves exhibiting high spectral purity and large high-frequency output.

The radiating oscillator apparatus for micro- and millimeter waves of according to this invention exhibits resonance with respect to an electromagnetic wave whose half wavelength is substantially equal to the distance between the opposite extremities of the paired fan-shaped conductor patches. Moreover, the distance between the fan-shaped conductor patch surfaces and the conductor planar surface extending parallel thereto is about 3 to 10 times the thickness of an ordinary strip line or of the circuit board used in a planar antenna substrate. Therefore, the paired fan-shaped conductor patches constitute a planar resonator whose coupling with space is weak. By selectively setting the fan-shaped conductor patch substrate thickness in this range and by varying the central angle of the fan-shaped conductor patches, the impedance matching and the feedback condition of the amplifier can be controlled to realize the conditions required for optimization as a radiating oscillator apparatus whose planar conductor patches function both as a resonator for high-frequency generation and an electromagnetic wave output element. By enabling high-frequency power generation efficiency and structural simplicity not obtainable with the prior art, this invention provides the high degree of freedom in laying out element arrays required for spatial power combining and, as such, can be expected to contribute to the advance of spatial synthesis by multi-element arrays, multi-element array beam shaping and numerous other technologies. The invention has promising applications in satellite and other millimeter wave mobile communication technology, radar technology and a wide range of technical fields requiring high output.

What is claimed is:

1. A radiating oscillator apparatus for micro- and millimeter waves comprising:

paired fan-shaped conductor patches disposed with their pointed portions in proximity and their arcuate portions on opposite sides, a distance from the pointed portion to the arcuate portion of each fan-shaped conductor patch being equal to about one-fourth of a wavelength of oscillating electromagnetic-wave, at least one high-frequency transistor disposed between and connected to the fan-shaped conductor patches, a conductor planar surface disposed under and parallel to the fan-shaped conductor patches at an interval of between one-fifteenth and one-fifth the wavelength of oscillating electromagnetic-wave therefrom, and a pair of direct current power supplies connected to the fan-shaped conductor patches separately with a common ground potential.

2. A radiating oscillator apparatus for micro- and millimeter waves comprising a plurality of the oscillator apparatuses for micro- and millimeter waves of claim 1 arrayed in a single plane to have the same polarity orientation.

3. A radiating oscillator apparatus for micro- and millimeter waves according to claim 1, wherein the high-frequency transistor is a field effect high-frequency transistor having a gate connected to one of the fan-shaped conductor patches, a drain connected to the other thereof and a source connected to ground.

4. A radiating oscillator apparatus for micro- and millimeter waves according to claim 1, wherein the high-frequency transistor is a junction high-frequency transistor having a base connected to one of the fan-shaped conductor patches, a collector connected to the other thereof and an emitter connected to ground.

5. A radiating oscillator apparatus for micro- and millimeter waves according to claim 1, wherein the at least one high-frequency transistor disposed midway between the fan-shaped conductor patches is multiple transistors connected in parallel.

6. A radiating oscillator apparatus for micro- and millimeter waves according to claim 1, wherein the high-frequency transistor is a high electron mobility transistor (HEMT), a MESFET transistor, a MOS transistor, a junction FET or other field effect transistor or is a bipolar transistor, a heterobipolar transistor (HBT) or other junction transistor.

7. A radiating oscillator apparatus for micro- and millimeter waves according to claim 1, wherein the paired fan-shaped conductor patches and the conductor planar surface opposed to the undersurfaces of the paired fan-shaped conductor patches are provided on opposite sides of a dielectric substrate composed of high-purity silicon, quartz, sapphire, alumina, PTFE or polyethylene.

* * * * *